(12) United States Patent
Jouan et al.

(10) Patent No.: US 7,470,559 B2
(45) Date of Patent: Dec. 30, 2008

(54) SEMICONDUCTOR COMPONENT COMPRISING A BURIED MIRROR

(75) Inventors: Sébastien Jouan, Crolles (FR); Michel Marty, Saint Paul de Varces (FR)

(73) Assignees: STMicroelectronics SA, Montrouge (FR); STMicroelectronics (Canada) Inc., Ontario (CA)

( * ) Notice: Subject to any disclaimer, the term of this patent is extended or adjusted under 35 U.S.C. 154(b) by 0 days.

(21) Appl. No.: 11/297,973

(22) Filed: Dec. 8, 2005

(65) Prior Publication Data
US 2006/0118897 A1 Jun. 8, 2006

(30) Foreign Application Priority Data
Dec. 8, 2004 (FR) .................................. 04 52900

(51) Int. Cl.
*H01L 21/00* (2006.01)
(52) U.S. Cl. .................. 438/65; 438/69; 257/E27.122; 257/E33.069
(58) Field of Classification Search .................. 438/65, 438/66, 69, 72, 48, 57, 64; 257/432, 435, 257/458, 461, 79, 80, 81, 82, E21.579, E27.122, 257/E27.133, E51.021, E33.069
See application file for complete search history.

(56) References Cited

U.S. PATENT DOCUMENTS

| | | | |
|---|---|---|---|
| 5,541,438 A | 7/1996 | Martin et al. | |
| 5,963,785 A * | 10/1999 | Katoh et al. ................... | 438/33 |
| 6,150,190 A | 11/2000 | Stankus et al. | |
| 6,429,463 B1 * | 8/2002 | Mauk ........................... | 257/98 |
| 6,667,528 B2 * | 12/2003 | Cohen et al. ................. | 257/469 |
| 7,276,770 B1 * | 10/2007 | Goushcha et al. ........... | 257/431 |
| 2002/0051071 A1 * | 5/2002 | Itano et al. ................... | 348/340 |
| 2002/0070417 A1 | 6/2002 | Kimura et al. | |
| 2004/0079951 A1 | 4/2004 | Horng et al. | |
| 2006/0186466 A1 * | 8/2006 | Mizokuchi et al. .......... | 257/330 |
| 2006/0284275 A1 * | 12/2006 | Deimel et al. ................ | 257/432 |

FOREIGN PATENT DOCUMENTS

DE  197 30 329 A1  1/1999

OTHER PUBLICATIONS

Article entitled: "Silicon-based resonant-cavity-enhanced photodiode with a buried $SiO_2$ reflector" by Sinnis, V.S., et al, published by Applied Physics Letters, American Institute of Physics, New York, USA, in vol. 74, No. 9, on Mar. 1, 1999, pp. 1203-1205.
International Search Report—France—re application FR 04/52900, dated Jun. 2, 2005.

* cited by examiner

*Primary Examiner*—W. David Coleman
*Assistant Examiner*—Khiem D Nguyen
(74) *Attorney, Agent, or Firm*—Lisa K. Jorgenson; Bryan A. Santarelli; Graybeal Jackson LLP

(57) ABSTRACT

A method for forming a buried mirror in a semiconductor component includes the steps of forming a structure comprising a semiconductor layer laid on an insulating layer covering a substrate; forming one or several openings in the semiconductor layer emerging at the surface of the insulating layer; eliminating a portion of the insulating layer, whereby a recess is formed; forming a second thin insulating layer against the wall of the recess; and forming a metal layer in the recess against the second insulating layer.

5 Claims, 4 Drawing Sheets

SEMICONDUCTOR COMPONENT COMPRISING A BURIED MIRROR

PRIORITY CLAIM

This application claims priority from French Patent Application No. 04/52900, filed Dec. 8, 2004, which is incorporated herein by reference.

BACKGROUND

1. Technical Field

Embodiments of the present invention relate to a mirror buried under an active semiconductor area of a semiconductor component such as a diode.

2. Discussion of the Related Art

FIGS. 1A and 1B are respectively a cross-section view and a top view of a metal-semiconductor-metal type photodiode MSM such as described in U.S. Pat. No. 5,525,828, which is incorporated by reference. The photodiode comprises an active semiconductor area 1 on which are formed two metal electrodes E1 and E2 preferably having an interdigited structure. Electrodes E1 and E2 are separated by an insulating area 2. This photodiode comprises a reflective element 3 such as a Bragg mirror placed under active area 1 above a substrate 4. An example of a Bragg mirror is a stacking of alternate silicon oxide and silicon nitride layers.

Each electrode E1 and E2 corresponds to the anode of a Schottky diode formed of an electrode E1 or E2 and of semiconductor area 1. The photodiode is thus equivalent to two Schottky diodes head-to-tail.

A voltage is applied between electrodes E1 and E2. In this example, electrode E1 is grounded and electrode E2 is at a positive voltage equal to 10 volts. The Schottky diodes having electrode E1 as an anode are reverse-biased. Accordingly, a space charge area forms under insulating area 2 between electrodes E1 and E2. The electric field induced by this space charge area is shown on FIG. 1A as a set of oriented curves running from electrode E2 at 10 V to grounded electrode E1.

Insulating area 2 is transparent to let through the photons of an incident light beam. These photons are absorbed by active semiconductor area 1 and "electron-hole" pairs are created. The electrons and the holes are accelerated by the electric field present in the space charge area, then collected by one of electrodes E1 and E2. An electric current is created between electrode E2 and electrode E1.

The photons which have not been absorbed by the active area before reaching the level of reflective mirror 3 are reflected towards the surface of active area 1. These photons can then be absorbed as they propagate back up. Because the maximum penetration depth of a photon into silicon is relatively high, approximately 17 microns, the use of a reflective mirror 3 enables "concentrating" the photons close to electrodes E1 and E2 where the electric field is high. This enables having more sensitive photodiodes exhibiting a higher operation frequency.

The use of Bragg mirrors, however, requires implementing complex manufacturing methods. One of the known methods comprises the forming of a stacking of silicon oxide and nitride layers on a support substrate, then the gluing of a silicon wafer on this stacking, followed by the planning of the silicon wafer to obtain an active area having a thickness of a few hundreds of nanometers. Furthermore, for a Bragg mirror to be reflective, very accurate silicon oxide and nitride thicknesses must be provided, which does not simplify their manufacturing. Furthermore, the Bragg mirror is typically reflective for a single wavelength value.

SUMMARY

An embodiment of the present invention provides a semiconductor component comprising a mirror which is reflective over a wide range of wavelength values.

Another embodiment of the present invention provides a method for manufacturing such a component.

Another embodiment of the present invention provides a very sensitive photodiode structure with a short response time.

An embodiment of the present invention provides a method for forming a buried mirror in a semiconductor component, comprising the steps of: forming a structure comprising a semiconductor layer laid on an insulating layer covering a substrate; forming one or several openings in the semiconductor layer emerging at the surface of the insulating layer; eliminating a portion of the insulating layer, whereby a recess is formed; forming a second thin insulating layer against the wall of the recess; and forming a metal layer in the recess against the second insulating layer.

In an embodiment of the previously-described method, the second thin insulating layer has a thickness smaller than one quarter of the wavelength of the light likely to be reflected by the mirror.

In an embodiment of the previously-described method, the method comprises, prior to the forming of the openings, the steps of: etching the semiconductor layer, the insulating layer, and the upper portion of the substrate to form a trench surrounding said portion of the insulating layer; and filling the previously-formed trench with a material different from said portion.

In an embodiment of the previously-described method, the substrate and the semiconductor layer are formed of single-crystal silicon, the insulating layer being formed of silicon oxide.

In an embodiment of the previously-described method, the metal layer is aluminum.

An embodiment of the present invention also provides an integrated circuit formed in an SOI-type wafer formed of a silicon layer placed on a silicon oxide layer covering a silicon substrate, and comprising a semiconductor component comprising a buried mirror placed under an active semiconductor area, a portion of the silicon oxide layer being replaced by the said mirror made of a metal layer covered with an insulating layer.

BRIEF DESCRIPTION OF THE DRAWINGS

The foregoing and other features and advantages of the present invention will be discussed in detail in the following non-limiting description of specific embodiments in connection with the accompanying drawings.

DETAILED DESCRIPTION

Figure 1A:
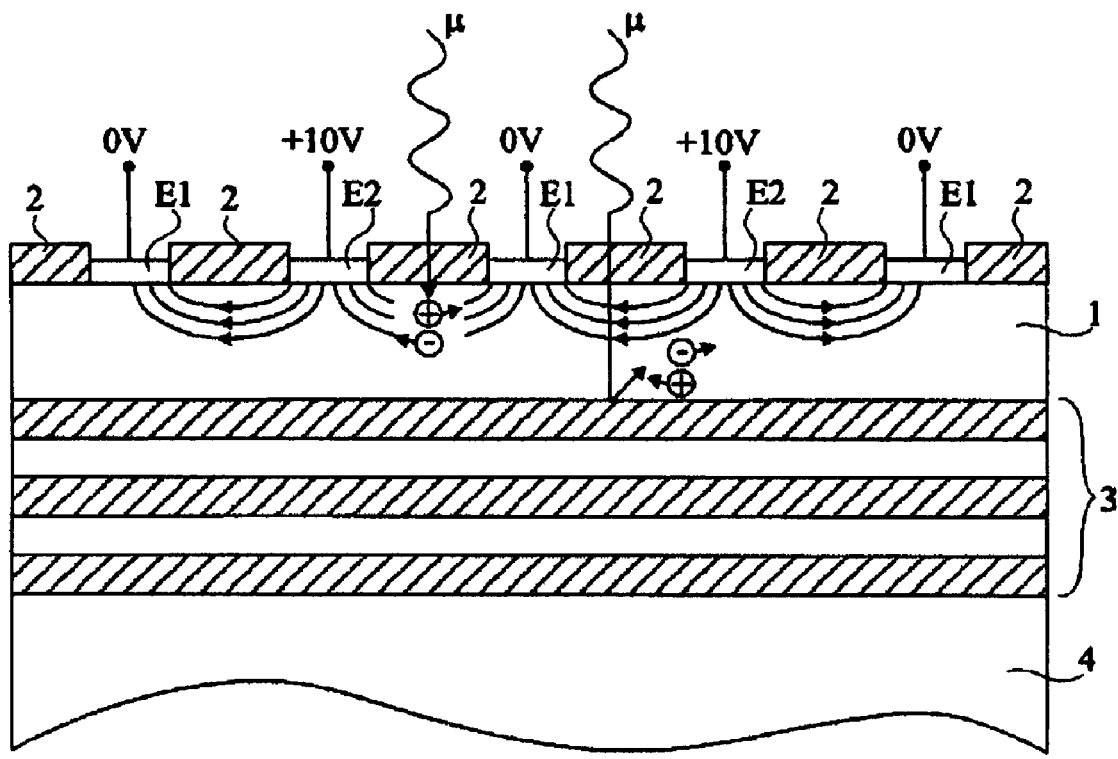
FIGS. 1A and 1B respectively are a cross-section view and a top view of a known MSM photodiode.
Figure 1B:
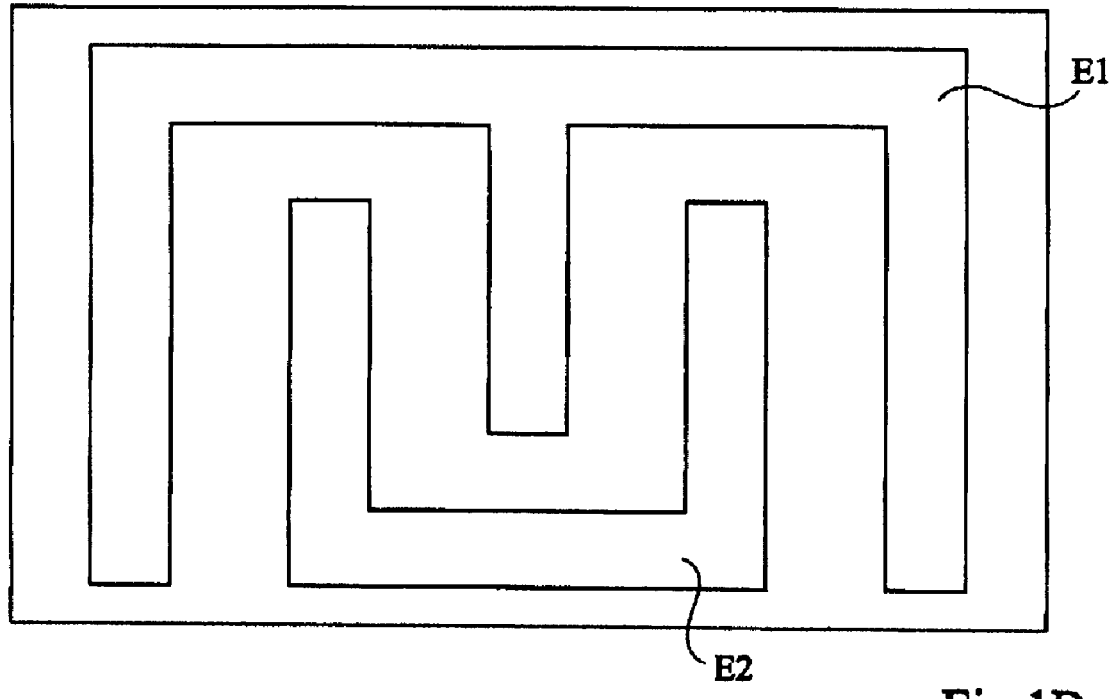

For clarity, same elements have been designated with same reference numerals in the different drawings and, further, as usual in the representation of integrated circuits, the various drawings may not be to scale.

An embodiment of the present invention provides forming a semiconductor component such as a photodiode comprising under an active semiconductor area a metal layer forming a mirror. An embodiment of the present invention also provides a method for forming such a mirror.

French Patent Application FR 0212278, which is incorporated by reference, describes an integrated circuit comprising a buried metal layer used to increase the conductivity of a semiconductor area of the circuit. This metal layer is formed of a strongly-conductive material such as copper, a metal silicide, a titanium nitride, or even doped polysilicon. Whatever the material used, the metal layer in contact with the semiconductor area tends to react with the latter to form a "transition" layer, generally a silicide layer formed of large clusters. The interface surface between the buried metal layer and the semiconductor area is thus typically rough and typically does not form a mirror likely to reflect a light beam in a wanted direction; it is instead a diffusing surface.

A component according to an embodiment of the present invention conversely comprises a buried metal layer exhibiting a "smooth" surface with a maximum reflection coefficient and a negligible diffusion coefficient.

Figure 2:
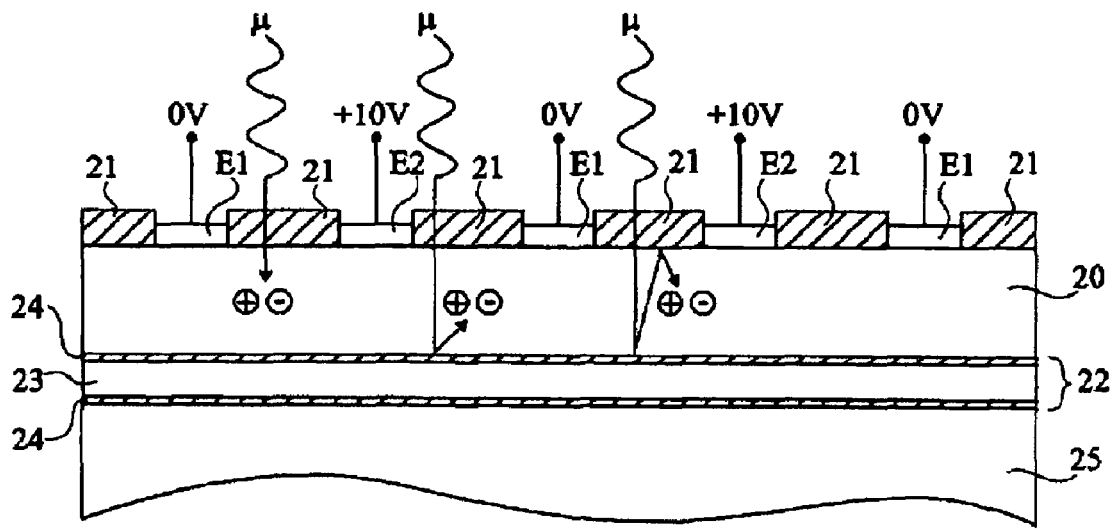
FIG. 2 is a cross-section view of an MSM-type photodiode according to an embodiment of the present invention.

FIG. 2 is a cross-section view of an MSM-type photodiode according to an embodiment of the present invention. The photodiode comprises an active semiconductor area 20 on which are placed metal electrodes E1 and E2. A transparent insulating layer 21 separates electrodes E1 and E2.

According to an embodiment of the present invention, a mirror 22 comprising a metal layer 23 covered with an insulating layer 24 is placed under active area 20, above a support layer 25. The portions of insulating layer 24 located above and under metal layer 23 are visible in this cross-section view. Insulating layer 24 is very thin, for example, of a thickness smaller than 20 nm, that is, much smaller than one quarter of the wavelength of the light that the mirror is likely to reflect. Thus, insulating layer 24 is not likely to create interference phenomena at the wavelength of interest and does not affect the reflection phenomena.

As explained previously, electrodes E1 and E2 are connected to different voltages. A space charge area forms under insulating layer 21 and an electric field is created between the two electrodes E1 and E2. An electric current is created between electrodes E1 and E2 when photons of an incident light beam are absorbed by active area 20.

The incident photons having crossed active area 20 without being absorbed by it are reflected by mirror 22, and more specifically by metal layer 23, and cross active area 20 again. Part of these reflected photons are then absorbed by the active area as they propagate back up. The photons reaching the interface between the active area and insulating layer 21 without being absorbed are partially reflected back into active area 20.

The thickness of the metal layer 23 is sufficient for this layer to be totally reflective. A thickness of a few tens of nanometers enables having a totally reflective mirror for light beams currently used in the visible, infrared, or ultraviolet wavelengths.

A photodiode according to an embodiment of the present invention can be obtained by a method according to an embodiment of the present invention described hereafter in relation to FIGS. 3A-3F.

Figure 3A:
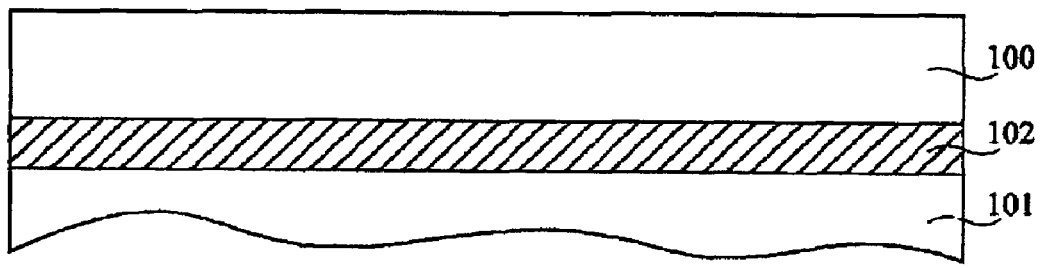
FIGS. 3A-3E are cross-section views and FIG. 3F is a perspective view illustrating structures obtained after successive steps of a method according to an embodiment of the present invention.

In an initial step, illustrated in FIG. 3A, a "semiconductor-insulator-substrate" structure comprising a semiconductor layer 100 resting on a substrate 101 covered with an insulating layer 102 is formed. This structure is, for example, a silicon-on-insulator (SOI) wafer that can be obtained according to various known methods. Whatever the method, the interface between semiconductor layer 100 and insulating layer 102 exhibits an excellent degree of flatness.

Figure 3B:
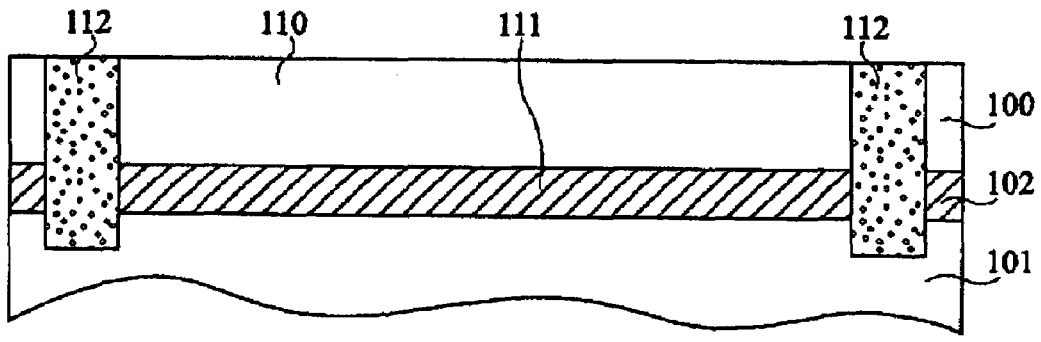

In a next step, illustrated in FIG. 3B, semiconductor layer 100, followed by insulating layer 102, and finally substrate 101, are etched to form an annular trench crossing layers 100 and 102 and penetrating into the surface of substrate 101. The trench is then filled with a material different from that of insulating layer 102 to form an annular wall 112 surrounding a portion 110 of semiconductor layer 100 and a portion 111 of insulating layer 102. Wall 112 is, for example, formed of polysilicon. In this example, the wall is substantially rectangular in top view. Portions are visible to the left and to the right of the shown structure.

Figure 3C:
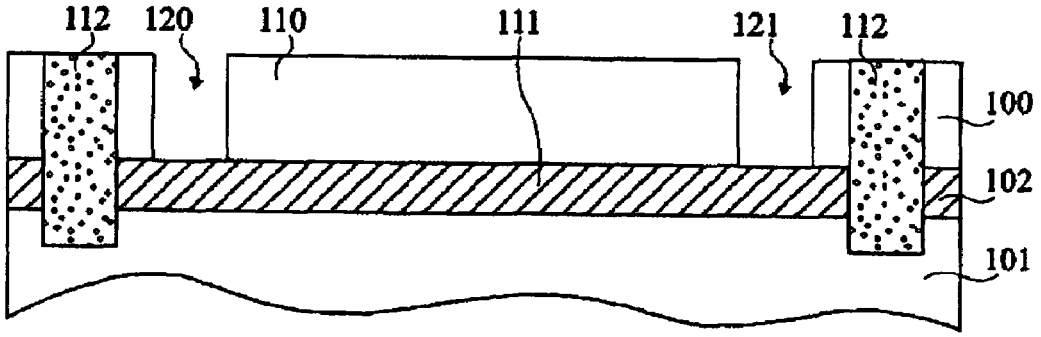

At the next step, illustrated in FIG. 3C, semiconductor layer 100 is etched to reach insulating layer 102 to form one or several openings in semiconductor portion 110 surrounded with wall 112. In this example, two openings 120 and 121 having the shape of substantially parallel trenches are formed close to the two shown portions of annular wall 112.

Figure 3D:
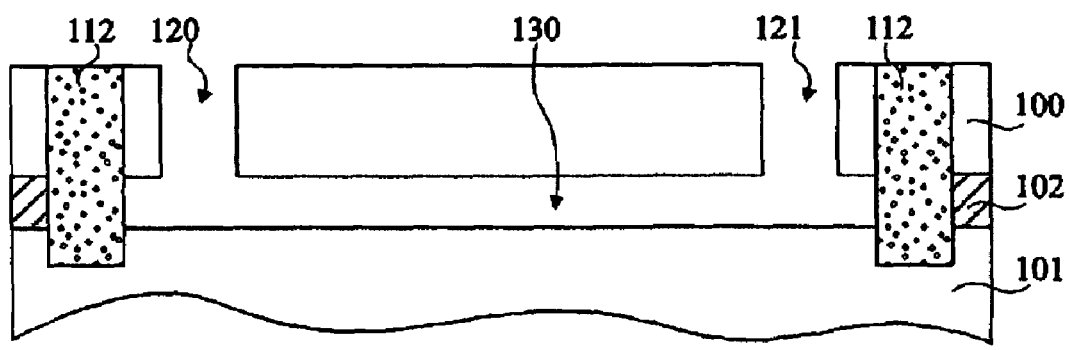

At the next step, illustrated in FIG. 3D, insulating portion 111 located within wall 112 is etched. The elimination of insulating portion 111 may be performed according to a conventional wet etch method, the portion being eliminated progressively from openings 120 and 121. At the end of this step, a recess 130 emerging at the surface of semiconductor layer 100 via openings 120 and 121 is obtained. A very selective etch method which does not etch the semiconductor layer is selected to keep the planeness of the lower surface of the semiconductor portion 110 at the level of the wall of recess 130.

Figure 3E:
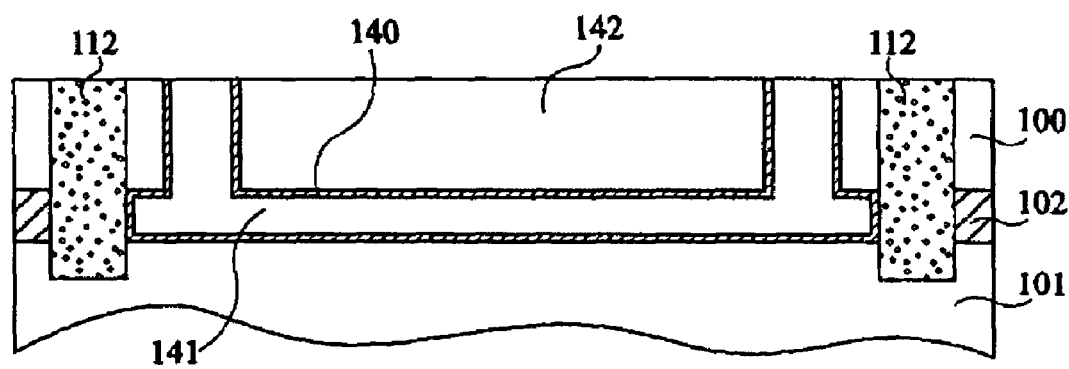

At the next step, illustrated in FIG. 3E, a protection layer 140 is deposited against the wall of recess 130. The protection layer for example is a thin silicon oxide layer obtained by thermal oxidation of semiconductor layer 100, of substrate 101, and of annular wall 113. Recess 130 and openings 120 and 121 are then filled with one or several metal materials. A deposition of from 10 to 30 nm of a metal such as aluminum according to an atomic layer deposition (ALD) method, followed by a chemical vapor deposition of a material such as silicon nitride to completely "fill" the recess, are for example performed. A buried metal layer 141 is then obtained. Metal layer 141 forms a mirror. The portion of semiconductor layer 100 located above this mirror forms an active area 142.

Protection layer 140 is provided to avoid any reaction between the semiconductor layer and the buried metal layer likely to form a large-cluster transition layer. Further, the protection layer "keeps" the flatness of the lower surface of the semiconductor layer so that the interface between the protection layer and metal layer 141 is as smooth as the semiconductor layer surface. Further, protection layer 140 can advantageously be used as a bonding layer ensuring a good hold of the metal layer.

Figure 3F:
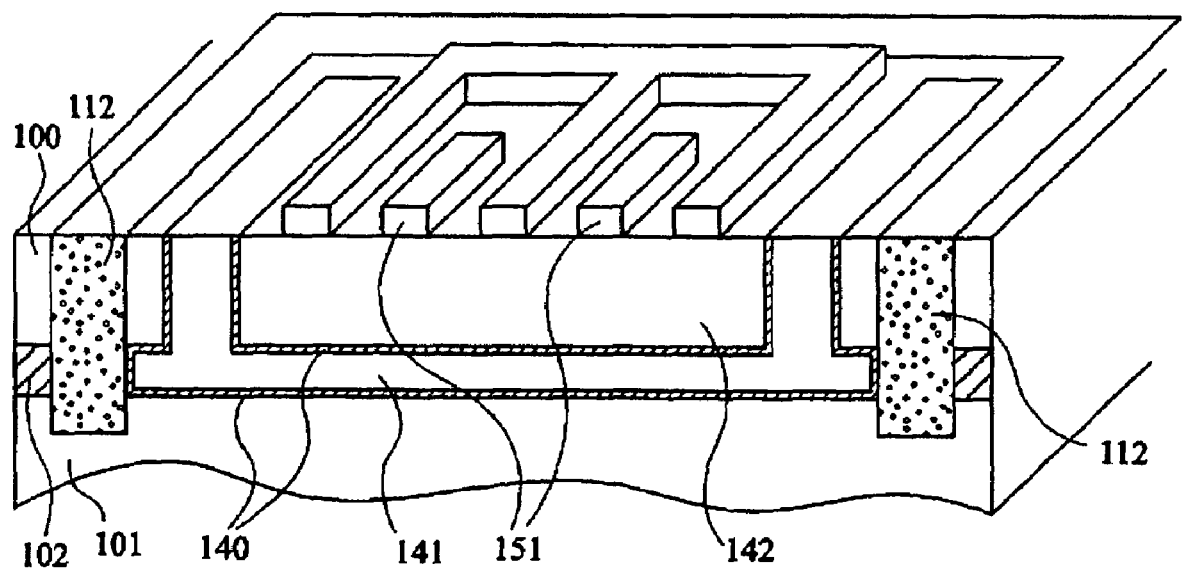

At the next step, illustrated in FIG. 3F, the elements corresponding to the photodiode type which is desired to be obtained are formed in and above active area 142. In this example, a photodiode of metal-semiconductor-metal type is formed. Two interdigited metal electrodes 150 and 151 are placed above active area 142.

According to a variation of the above-described method, the interdigited metal electrodes are formed prior to the forming of the buried mirror, by covering the electrodes with a protection material.

In the case where the previously-formed photodiode belongs to an integrated circuit comprised of several components, it is desirable for active area 142 to be electrically isolated from the substrate and from the rest of semiconductor layer 100. For this purpose, protection layer 140 is formed of an insulating material such as silicon oxide and annular wall 112 is insulating. The annular wall may be formed of doped silicon with doping elements different from those that may be present in active area 142. The annular wall may also be formed of polysilicon covered with a silicon oxide layer. In this last case, prior to the filling with polysilicon of the openings crossing semiconductor layer 100, insulating layer 101, and emerging at the surface of substrate 102, a thin silicon oxide layer is formed against the opening walls.

Figure 4:
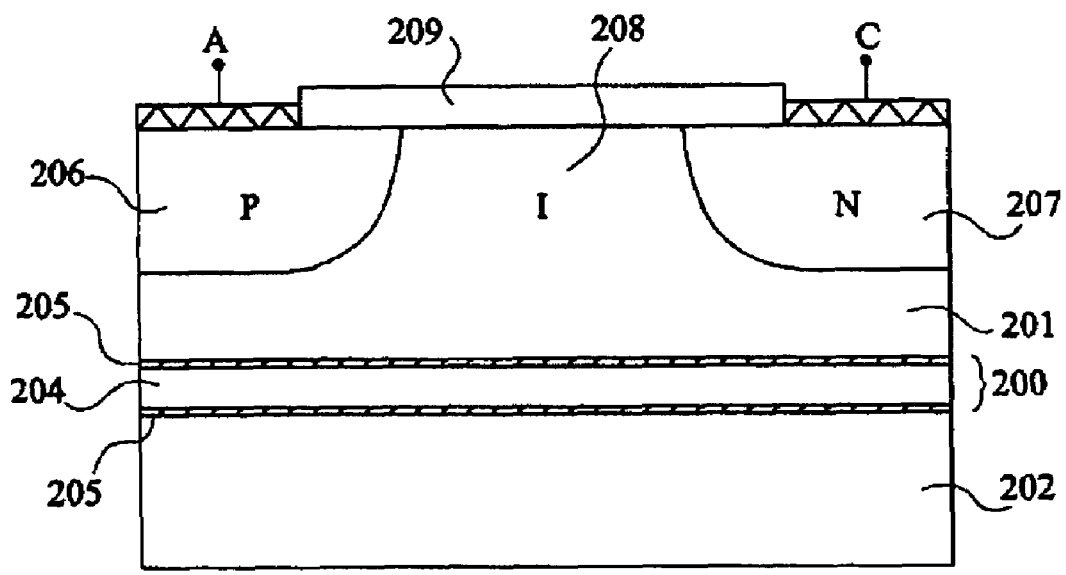
FIG. 4 is a cross-section view of a lateral photodiode according to another embodiment of the present invention.

FIG. 4 is a cross-section view of a lateral photodiode according to an embodiment of the present invention comprising a buried mirror that can be obtained according to the previously described method. The photodiode comprises a mirror 200 placed under an active semiconductor area 201 and above a substrate 202. The mirror is formed of a metal layer 204 covered with an insulating layer 205. A P-type doped area 206 and an N-type doped area 207 separated by a so-called "intrinsic" undoped area 208 are formed at the surface of active area 201. Anode and cathode metallizations A and C respectively cover areas 206 and 207. An insulating layer 209 is placed between the anode and cathode metallizations above intrinsic area 208.

In operation, the PIN photodiode is reverse-biased. Its cathode is at a higher voltage than its anode to form a large space charge area. The photons of an incident light beam crossing insulating layer 209 are absorbed by the substrate and create "electron-hole" pairs. The carriers of each pair are accelerated by the strong electric field present in the space charge area. The holes move towards the anode and the electrons move towards the cathode. Accordingly, when the photodiode receives a light beam, a current flows between the cathode and the anode.

Mirror 200 reflects the incident photons which have crossed active area 201 without being absorbed. Part of these reflected photons are then absorbed by the active area as they propagate back up. The photons reaching the interface between active area 200 and insulating layer 208 without being absorbed are partially reflected back into active area 201.

Figure 5:
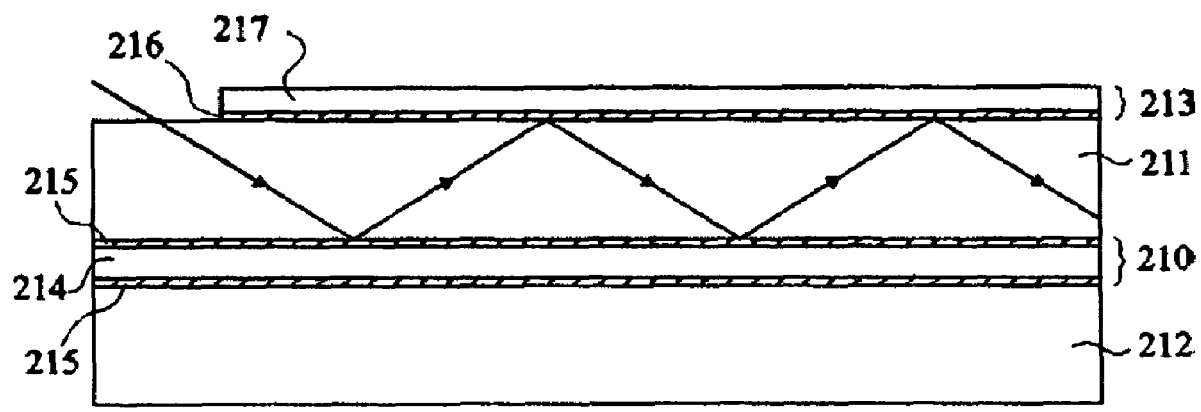
FIG. 5 is a cross-section view of a wave guide according to another embodiment of the present invention.

FIG. 5 is a cross-section view of a wave guide according to an embodiment of the present invention. This wave guide comprises a "buried" mirror 210 placed under an active semiconductor area 211, above a substrate 212, and a mirror 213 placed on active area 211. Mirror 210 is formed of a metal area 214 covered with an insulating layer 215, the portions of insulating layer 215 located under and on metal layer 214 being visible in this cross-section view. Mirror 213 is formed of a stacking of an insulating layer 216 and of a metal layer 217.

An incident light beam can penetrate into active area 211 through an exposed surface portion of the active area. The beam is then alternately reflected by mirror 210 and mirror 213 to reach an exit of the wave guide or a sensor (not shown).

Those skilled in the art may devise other semiconductor components comprising a metal layer as a mirror placed under an active semiconductor area. A frequency demultiplexer of a light beam having a structure substantially identical to that of the wave guide shown in FIG. 5 and comprising a series of filter areas placed above active area 211 in openings of mirror 213 may for example be formed.

Generally, the manufacturing method of a buried mirror according to an embodiment of the present invention comprises the forming of a reflective metal layer under an active semiconductor area of a semiconductor component formed in a "semiconductor-insulator-substrate" structure comprising a semiconductor layer resting on an insulating layer covering a substrate. The mirror manufacturing method includes eliminating a portion of the insulating layer of the semiconductor-insulator-substrate, and of filling the recess thus formed with a protection layer, then with a metal layer.

A metal layer exhibiting as planar a surface as possible to "control" the reflection is formed. For this purpose, a "semiconductor-insulator-substrate" structure exhibiting an interface between the semiconductor layer and the insulating layer which is as smooth as possible to obtain, after elimination of the insulating portion, a recess exhibiting as planar a surface as possible, is used.

Further, filling materials enabling "keeping" the smoothness of the recess are selected, and to avoid any prejudicial reaction between the metal layer and the semiconductor layer, a protection layer which does not modify the state of the recess surface is formed.

Moreover, the reflective metal layer is formed according to a deposition method providing the smallest possible clusters so that the reflective metal layer has as smooth a surface as possible. The currently best adapted method is an atomic layer deposition method.

An advantage of a component according to an embodiment of the present invention is that it comprises, as a mirror, a metal layer which is reflective whatever the wavelength of the incident beam.

Of course, embodiments of the present invention are likely to have various alterations, modifications, and improvements which will readily occur to those skilled in the art. In particular, it will be within the abilities of those skilled in the art to devise other semiconductor components according to the present invention. Further, those skilled in the art may devise other methods for eliminating a portion of the insulating layer of the initial semiconductor-insulator-substrate structure.

Referring to FIGS. 2 and 4, the semiconductor components may be disposed in an integrated circuit (IC), which may be part of a larger system such as a computer system.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A method for forming a buried mirror in a semiconductor component, comprising:

forming a structure comprising a semiconductor layer laid on an insulating layer covering a substrate;

forming one or several openings in the semiconductor layer emerging at the surface of the insulating layer;

eliminating a portion of the insulating layer, whereby a recess is formed;

forming a second thin insulating layer against the wall of the recess; and forming a metal layer in the recess against the second insulating layer.

2. The method of claim 1, wherein the second thin insulating layer has a thickness smaller than one quarter of the wavelength of the light likely to be reflected by the mirror.

3. The method of claim 1, comprising, prior to the forming of the openings, the steps of:

etching the semiconductor layer, the insulating layer, and the upper portion of the substrate to form a trench surrounding said portion of the insulating layer; and filling the previously-formed trench with a material different from said portion.

4. The method of claim 1, wherein the substrate and the semiconductor layer are formed of single-crystal silicon, the insulating layer being formed of silicon oxide.

5. The method of claim 1, wherein the metal layer is aluminum.

\* \* \* \* \*